(12) United States Patent
Niwa

(10) Patent No.: US 12,451,453 B2
(45) Date of Patent: Oct. 21, 2025

(54) SEMICONDUCTOR DEVICE, SUBSTRATE, AND METHOD FOR MANUFACTURING SEMICONDUCTOR DEVICE

(71) Applicant: KIOXIA CORPORATION, Tokyo (JP)

(72) Inventor: Keiichi Niwa, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 552 days.

(21) Appl. No.: 17/895,397

(22) Filed: Aug. 25, 2022

(65) Prior Publication Data

US 2023/0170321 A1 Jun. 1, 2023

(30) Foreign Application Priority Data

Nov. 26, 2021 (JP) .................. 2021-192230

(51) Int. Cl.
*H01L 23/00* (2006.01)
*H01L 21/48* (2006.01)
(Continued)

(52) U.S. Cl.
CPC .......... *H01L 24/14* (2013.01); *H01L 21/4857* (2013.01); *H01L 23/49822* (2013.01);
(Continued)

(58) Field of Classification Search
CPC ................. H01L 24/14; H01L 21/4857; H01L 23/49822; H01L 23/49838; H01L 24/16; H01L 25/0657; H01L 25/18; H01L 2224/14051; H01L 2224/16227; H01L 2225/06506; H01L 2225/06517; H01L 2225/06562; H01L 2225/06575;
(Continued)

(56) References Cited

U.S. PATENT DOCUMENTS 10,256,175 B2 4/2019 Ishihara et al.
10,665,535 B2 5/2020 Lee et al.
(Continued)

FOREIGN PATENT DOCUMENTS

JP 2001-284810 A 10/2001
JP 2017-152646 A 8/2017
(Continued)

*Primary Examiner* — Douglas W Owens
(74) *Attorney, Agent, or Firm* — Foley & Lardner LLP

(57) ABSTRACT

A semiconductor device includes a substrate having a first surface, a second surface opposite to the first surface, conductive connections provided on the first surface, and columnar electrodes each extending from a corresponding one of the conductive connections toward the second surface, each of the columnar electrodes having a tapered shape; and a semiconductor chip having a third surface facing the first surface and a plurality of connection bumps provided on the third surface, each of the plurality of connection bumps electrically connected to a corresponding one of the plurality of conductive connections. A first one of the columnar electrodes, located in a first region of a chip region, has a first tapered shape. A second one of the columnar electrodes, located in a second region of the chip region, has a second tapered shape different from the first tapered shape.

17 Claims, 17 Drawing Sheets

(51) Int. Cl.
*H01L 23/498* (2006.01)
*H01L 25/065* (2023.01)
*H01L 25/18* (2023.01)

(52) U.S. Cl.
CPC ........ *H01L 23/49838* (2013.01); *H01L 24/16* (2013.01); *H01L 25/0657* (2013.01); *H01L 25/18* (2013.01); *H01L 2224/14051* (2013.01); *H01L 2224/16227* (2013.01); *H01L 2225/06506* (2013.01); *H01L 2225/06517* (2013.01); *H01L 2225/06562* (2013.01); *H01L 2225/06575* (2013.01); *H01L 2225/06586* (2013.01); *H01L 2924/1431* (2013.01); *H01L 2924/14511* (2013.01); *H01L 2924/3511* (2013.01)

(58) Field of Classification Search
CPC . H01L 2225/065876; H01L 2924/1431; H01L 2924/14511; H01L 2924/3511; H01L 24/81; H01L 23/49816; H01L 23/49827; H01L 24/06; H01L 24/03; H01L 24/05; H01L 24/11; H01L 24/13; H01L 24/17; H01L 23/12; H01L 24/10
See application file for complete search history.

(56) References Cited

U.S. PATENT DOCUMENTS

| | | |
|---|---|---|
| 10,770,408 B2 | 9/2020 | Ogawa |
| 2010/0140805 A1* | 6/2010 | Chang ..................... H01L 24/16 257/E21.538 |
| 2014/0097009 A1* | 4/2014 | Kaneko ............. H01L 23/49822 174/258 |
| 2017/0250153 A1 | 8/2017 | Kikuchi et al. |
| 2017/0256470 A1* | 9/2017 | Sakamoto ............... H01L 24/20 |
| 2020/0109047 A1* | 4/2020 | Tsuyutani ............... H01L 24/19 |
| 2020/0168536 A1* | 5/2020 | Link ................. H01L 23/49827 |
| 2020/0279804 A1 | 9/2020 | Huang et al. |
| 2021/0183784 A1* | 6/2021 | Hwang ................. H01L 24/32 |
| 2021/0327796 A1 | 10/2021 | Chen et al. |
| 2022/0013455 A1* | 1/2022 | Ohno ............... H01L 23/49811 |
| 2022/0199480 A1* | 6/2022 | Karhade ................ H01L 24/11 |
| 2022/0210921 A1* | 6/2022 | Ham ................. H01L 23/5383 |

FOREIGN PATENT DOCUMENTS

| | | |
|---|---|---|
| JP | 2018-032657 A | 3/2018 |
| JP | 2019-087719 A | 6/2019 |
| JP | 2019-197770 A | 11/2019 |

* cited by examiner

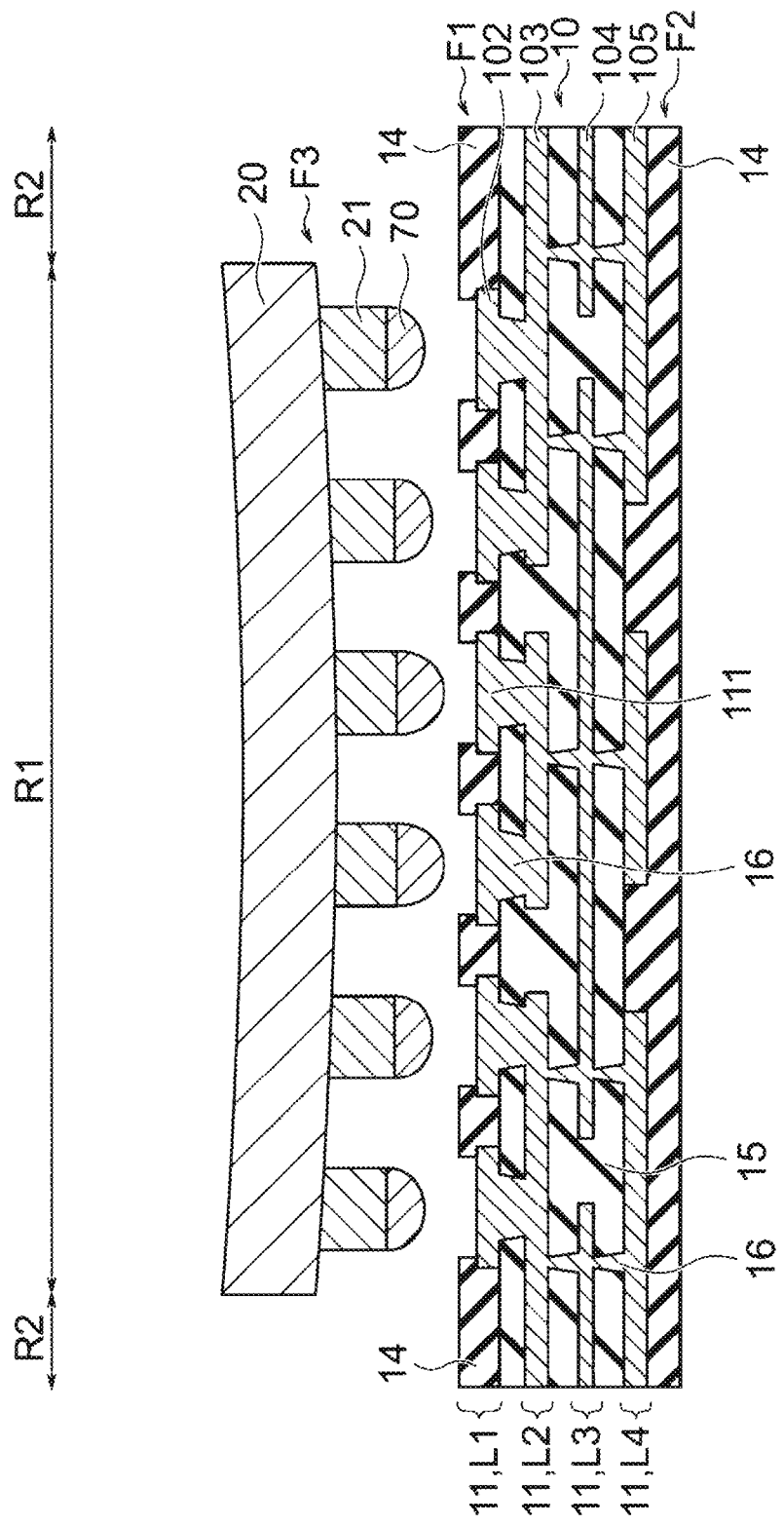

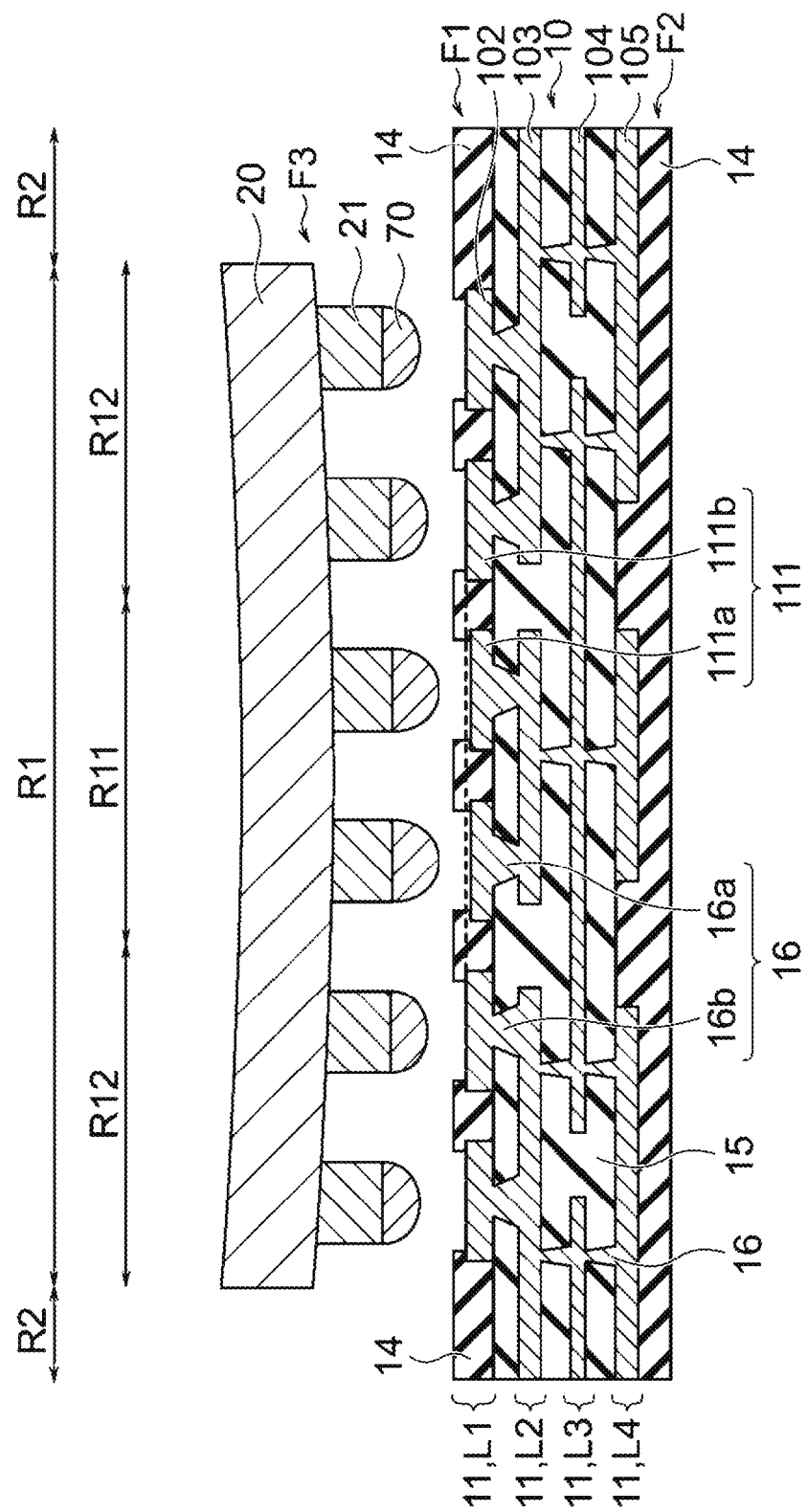

SEMICONDUCTOR DEVICE, SUBSTRATE, AND METHOD FOR MANUFACTURING SEMICONDUCTOR DEVICE

CROSS-REFERENCE TO RELATED APPLICATION

This application is based upon and claims the benefit of priority from Japanese Patent Application No. 2021-192230, filed Nov. 26, 2021, the entire contents of which are incorporated herein by reference.

FIELD

Embodiments described herein relate generally to a semiconductor device, a substrate, and a method for manufacturing the semiconductor device.

BACKGROUND

In some cases, in a package structure of a semiconductor device, a semiconductor chip is flipped and connected to a wiring substrate. However, in some cases, due to warpage of the semiconductor chip, it is difficult to appropriately connect the semiconductor chip to the wiring substrate.

DESCRIPTION OF THE DRAWINGS

FIG. 8 is a cross-sectional view illustrating an example of a configuration of a semiconductor chip and surroundings thereof according to Comparative Example 1.

FIG. 15 is a cross-sectional view illustrating an example of a configuration of a semiconductor chip and surroundings thereof according to a fifth embodiment.

DETAILED DESCRIPTION

Figure 1:
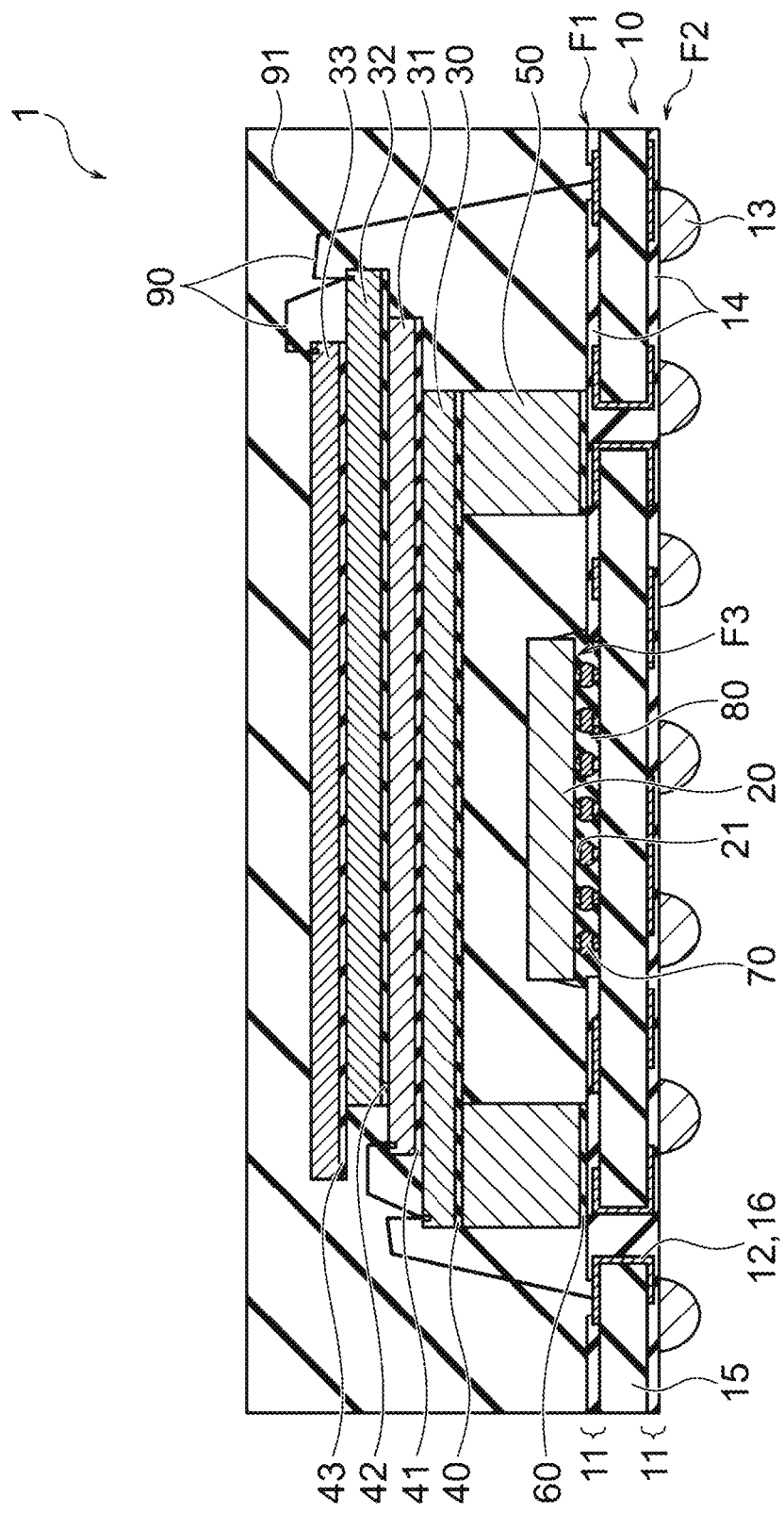
FIG. 1 is a cross-sectional view illustrating an example of a configuration of a semiconductor device according to a first embodiment.

Embodiments provide a semiconductor device, a substrate, and a method for manufacturing the semiconductor device capable of more appropriately connecting a chip to a substrate.

In general, according to one embodiment, a semiconductor device includes a substrate having a first surface, a second surface opposite to the first surface, a plurality of conductive connections provided on the first surface, and a plurality of columnar electrodes each extending from a corresponding one of the plurality of conductive connections toward the second surface, each of the plurality of columnar electrodes having a tapered shape; and a semiconductor chip having a third surface facing the first surface and a plurality of connection bumps provided on the third surface, each of the plurality of connection bumps electrically connected to a corresponding one of the plurality of conductive connections. A first one of the columnar electrodes, located in a first region of a chip region, has a first tapered shape. A second one of the columnar electrodes, located in a second region of the chip region, has a second tapered shape different from the first tapered shape.

Hereinafter, embodiments according to the present disclosure will be described with reference to the drawings. The embodiments do not limit the present disclosure. In the following embodiments, a vertical direction of a wiring substrate indicates a relative direction when a surface on which the semiconductor chip is provided is allowed to face up and may be different from a vertical direction according to the gravity acceleration. The drawings are schematic or conceptual and a ratio of each component is not always the same as an actual ratio. In the specification and the drawings, the same elements as those described above with respect to the above-mentioned drawings are denoted by the same reference numerals, and detailed description thereof will be omitted as appropriate.

First Embodiment

FIG. 1 is a cross-sectional view illustrating an example of a configuration of a semiconductor device 1 according to a first embodiment. The semiconductor device 1 is provided with a wiring substrate 10, semiconductor chips 20 and 30 to 33, adhesive layers 40 to 43, a spacer 50, an adhesive layer 60, a metal material 70, a resin layer 80, a bonding wire 90, and a sealing resin 91. The semiconductor device 1 is, for example, a package of a NAND flash memory.

The wiring substrate 10 may be a printed board or an interposer including wiring layers 11 and an insulating layer 15. For example, a low resistance metal such as copper (Cu), nickel (Ni) or an alloy thereof is used for the wiring layer 11. For example, an insulating material such as a glass epoxy resin is used for the insulating layer 15. In this figure, the wiring layers 11 are provided only on a front surface and a rear surface of the insulating layer 15. However, the wiring substrate 10 may have a multi-layer wiring structure in which a plurality of the wiring layers 11 and a plurality of the insulating layers 15 are stacked. For example, like the interposer, the wiring substrate 10 may have a through via 12 (columnar electrode 16) penetrating a front surface and a rear surface thereof.

A solder resist layer 14 provided on the wiring layer 11 is provided on the front surface (surface F1) of the wiring substrate 10. The solder resist layer 14 is also used as an insulating layer for protecting the wiring layer 11 from the metal material 70 and preventing short circuit defects.

The solder resist layer 14 provided on the wiring layer 11 is also provided on the rear surface (surface F2) of the wiring substrate 10. A metal bump 13 is provided on the wiring layer 11 exposed from the solder resist layer 14. The metal bumps 13 electrically connect other components (not illustrated) to the wiring substrate 10.

The semiconductor chip 20 is, for example, a controller chip that controls a memory chip. A semiconductor element (not illustrated) is provided on a surface F3 of the semiconductor chip 20 facing the wiring substrate 10. The semiconductor element may be, for example, a complementary metal oxide semiconductor (CMOS) circuit configuring a controller. The surface F3, which is a rear surface (lower surface) of the semiconductor chip 20, is provided with electrode pillars 21 that are electrically connected to the semiconductor element. A low resistance metal material such as copper, nickel or an alloy thereof is used for the electrode pillar 21.

The metal material 70 is provided around the electrode pillar 21 as a connection bump. The electrode pillar 21 is electrically connected to the wiring layer 11 exposed to an opening of the solder resist layer 14 via the metal material 70. For example, a low resistance metal material such as solder, silver, or copper is used as the metal material 70. The metal material 70 covers, for example, a portion of the wiring layer 11 of the wiring substrate 10 in the opening and also covers a portion of a side surface of the electrode pillar 21 of the semiconductor chip 20. Accordingly, the metal materials 70 electrically connect the electrode pillars 21 of the semiconductor chip 20 and the wiring layers 11 of the wiring substrate 10.

The resin layer 80 is provided in a region around the metal material 70 and in a region between the semiconductor chip 20 and the wiring substrate 10. The resin layer 80 is a layer formed by curing, for example, an under-fill resin and covers and protects a periphery of the semiconductor chip 20.

The semiconductor chip 30 is, for example, a memory chip including the NAND flash memory. The semiconductor chip 30 has a semiconductor element (not illustrated) on a front surface thereof (upper surface). The semiconductor element may be, for example, a memory cell array and a peripheral circuit thereof (CMOS circuit). The memory cell array may be a three-dimensional memory cell array in which a plurality of memory cells are three-dimensionally located. In addition, the semiconductor chip 31 adheres onto the semiconductor chip 30 via the adhesive layer 41. The semiconductor chip 32 adheres onto the semiconductor chip 31 via the adhesive layer 42. The semiconductor chip 33 adheres onto the semiconductor chip 32 via the adhesive layer 43. For example, like the semiconductor chip 30, the semiconductor chips 31 to 33 are memory chips including the NAND flash memory. The semiconductor chips 30 to 33 may be the same memory chips. In this figure, in addition to the semiconductor chip 20 as a controller chip, the semiconductor chips 30 to 33 as four memory chips are stacked. However, the number of stacked semiconductor chips may be three or less or five or more.

The spacer 50 is provided, for example, on a side of the semiconductor chip 20. The spacer 50 adheres onto the front surface (upper surface) of the wiring substrate 10 via the adhesive layer 60. The adhesive layer 60 is provided between the wiring substrate 10 and the spacer 50. The semiconductor chips 30 to 33 are provided above the spacer 50. A material of the spacer 50 is, for example, silicon (Si) or polyimide.

The bonding wire 90 is connected to the wiring substrate 10 and any pad of the semiconductor chips 30 to 33. In order to connect with the bonding wire 90, the semiconductor chips 30 to 33 are stacked to be shifted by an amount corresponding to the pads. Since the semiconductor chip 20 is flip-chip connected by the electrode pillars 21, the semiconductor chip 20 is not wire-bonded. However, the semiconductor chip 20 may also be wire-bonded in addition to the connection by the electrode pillars 21.

Furthermore, the sealing resin 91 seals the semiconductor chips 20 and 30 to 33, the adhesive layers 40 to 43 and 60, the spacer 50, the bonding wire 90, and the like. Accordingly, the semiconductor device 1 is configured as one semiconductor package including a plurality of semiconductor chips 20 and 30 to 33 on the wiring substrate 10. When there is no resin layer 80, instead of the resin layer 80, the sealing resin 91 may be in the region around the metal material 70 and in the region between the semiconductor chip 20 and the wiring substrate 10.

Next, the details of the connection between the wiring substrate 10 and the semiconductor chip 20 will be described.

Figure 2:
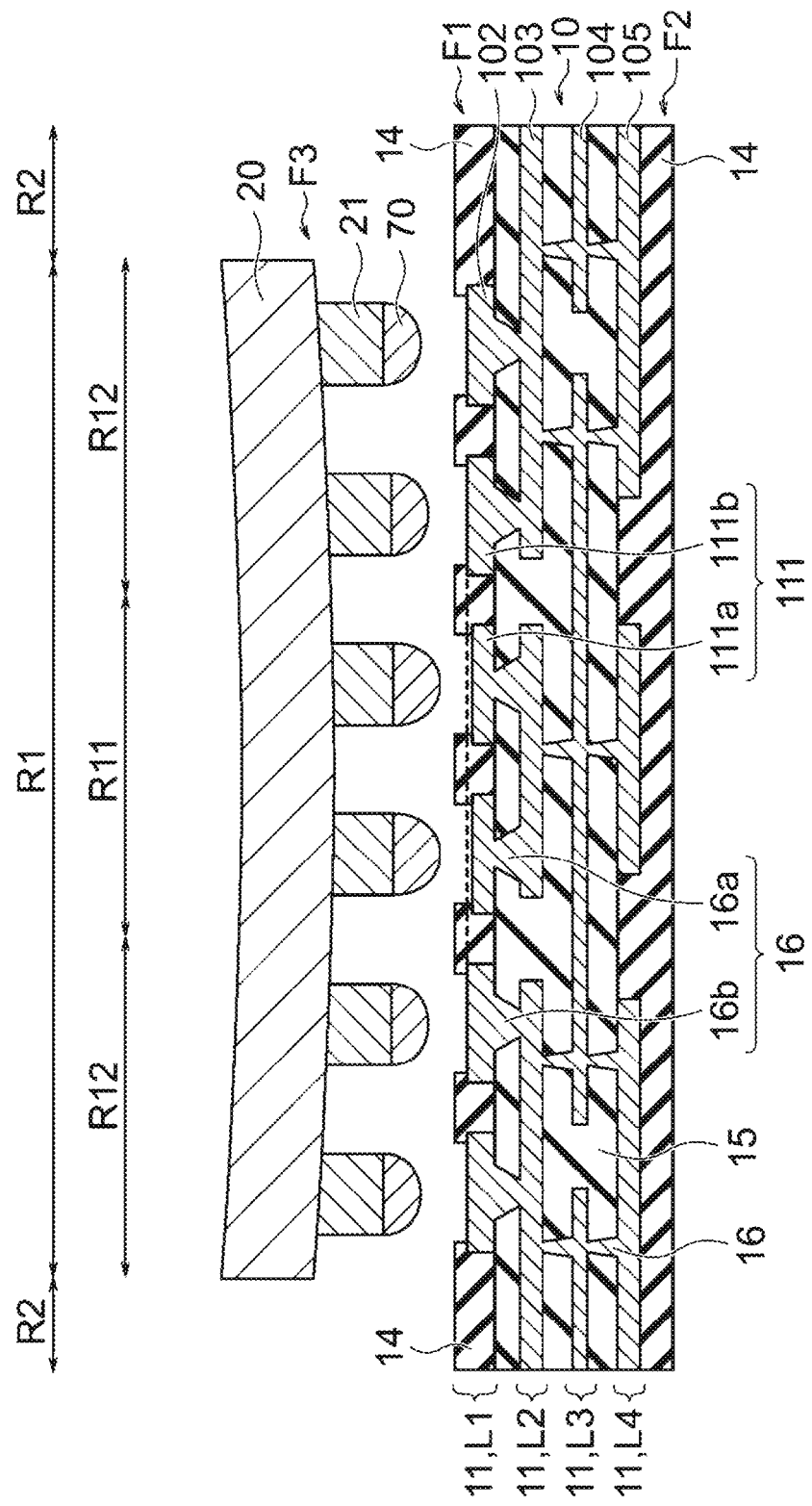
FIG. 2 is a cross-sectional view illustrating an example of a configuration of a semiconductor chip and surroundings thereof according to the first embodiment.

FIG. 2 is a cross-sectional view illustrating an example of a configuration of the semiconductor chip 20 and surroundings thereof according to the first embodiment. It is noted that FIG. 2 illustrates a cross-sectional view at the timing of connection of the semiconductor chip 20 to the wiring substrate 10. The timing of connection between the wiring substrate 10 and the semiconductor chip 20 is, for example, a reflow process, which is a period during which the metal materials 70 are heat-treated to a temperature equal to or higher than a melting point.

The topmost wiring layer 11 located on the surface F1 side includes a plurality of conductive connection portions 111.

The conductive connection portions 111 are provided on the surface F1. The conductive connection portions 111 are located in a chip region R1 on the surface F1 where the semiconductor chip 20 is located. At least a portion of each conductive connection portion 111 is exposed from the solder resist layer 14. The conductive connection portion 111 electrically connects the wiring substrate 10 and the semiconductor chip 20 by being in contact with the metal materials 70. A plurality of the electrode pillars 21 provided on the surface F3 are electrically connected to each of the plurality of conductive connection portions 111 provided on the surface F1.

The conductive connection portion 111 includes a conductive connection portion 111a and a conductive connection portion 111b.

The conductive connection portion 111a is located in a region R11 of the chip region R1. The region R11 is, for example, a chip center region.

The conductive connection portion 111b is located in a region R12 of the chip region R1. The region R12 is, for example, a chip outer peripheral region.

The chip region R1 is divided into, for example, the region R11 and the region R12 other than the region R11. An area of the region R11, which is the chip center region, is, for example, one half or less of a chip size, and an area of the region R12, which is the chip outer peripheral region, is, for example, one half or more of the chip size (refer to FIG. 3). However, a ratio of the areas is not limited thereto and may be changed.

Herein, the semiconductor chip 20 illustrated in FIG. 2 is warped to be convex downward in the reflow process. The warpage of the semiconductor chip 20 is caused by, for example, a difference in a thermal expansion coefficient between a material of the semiconductor substrate (for example, silicon (Si)) and a metal of the semiconductor element. For example, as a package becomes thinner, the semiconductor chip 20 becomes thinner, and thus, the warpage of the semiconductor chip 20 is likely to occur.

As illustrated in FIG. 2, the conductive connection portion 111b located in the region R12 has a thickness different from that of the conductive connection portion 111a located in the region R11. Accordingly, even if the warpage of the semiconductor chip 20 occurs, the wiring substrate 10 and the semiconductor chip 20 can be more appropriately connected.

More specifically, the conductive connection portion 111b located in the region R12 is thicker than the conductive connection portion 111a located in the region R11. Accordingly, even if the semiconductor chip 20 is warped to be convex downward, the wiring substrate 10 and the semiconductor chip 20 can be appropriately connected in the region R12 which is the chip outer peripheral region.

As described above, it is preferable that the conductive connection portions 111a and 111b have thicknesses corresponding to the warpage of the semiconductor chip 20 at the timing of connection with the semiconductor chip 20. That is, it is preferable to change the thicknesses of the conductive connection portions 111a and 111b to follow the warpage of the semiconductor chip 20.

Further, it is preferable that a difference between the thickness of the conductive connection portion 111b located in the region R12 and the thickness of the conductive connection portion 111a located in the region R11 corresponds to the warpage of the semiconductor chip 20 at the timing of connection with the wiring substrate 10. An amount of warpage of the semiconductor chip 20 is, for example, a difference in height between a center portion and an outer peripheral end portion of the semiconductor chip 20.

The difference in the thickness between the conductive connection portion 111a and the conductive connection portion 111b is generated by the columnar electrodes 16 extending from the conductive connection portions 111a and 111b.

The plurality of columnar electrodes 16 extend from each of the plurality of conductive connection portions 111 toward the surface F2. The surface F2 is a surface of the wiring substrate 10 on a side opposite to the surface F1. The columnar electrode 16 has a tapered shape.

The columnar electrode 16 includes a columnar electrode 16a and a columnar electrode 16b.

The columnar electrode 16a is located in the region R11 of the chip region R1 when viewed from a normal line direction of the surface F1. The columnar electrode 16a electrically connects an L1 wiring layer 102 and any one (for example, an L2 wiring layer 103) of an L2 wiring layer 103 to an L4 wiring layer 105.

In the example illustrated in FIG. 2, the columnar electrode 16a located in the region R11 has a tapered shape of which width (diameter) increases from the surface F1 toward the surface F2. The columnar electrode 16a (VIA) is a reverse via.

The columnar electrode 16b is located in the region R12 of the chip region R1 when viewed from the normal line direction of the surface F1. The columnar electrode 16b electrically connects the L1 wiring layer 102 and any one (for example, the L2 wiring layer 103) of the L2 wiring layer 103 to the L4 wiring layer 105.

In the example illustrated in FIG. 2, the columnar electrode 16b located in the region R12 has a tapered shape of which width decreases from the surface F1 toward the surface F2. The columnar electrode 16b is a forward via (a normal via).

The columnar electrode 16a located in the region R11 has a tapered shape in a direction opposite to that of the columnar electrode 16b located in the region R12. That is, the columnar electrodes 16b which are normal vias and the columnar electrodes 16a which are reverse vias are mixed in the columnar electrodes 16 each extending from one of the plurality of conductive connection portions 111 flip-chip connected to the semiconductor chip 20. The details of a relationship between the conductive connection portion 111 and the columnar electrode 16 will be described later with reference to FIG. 5.

Figure 3:
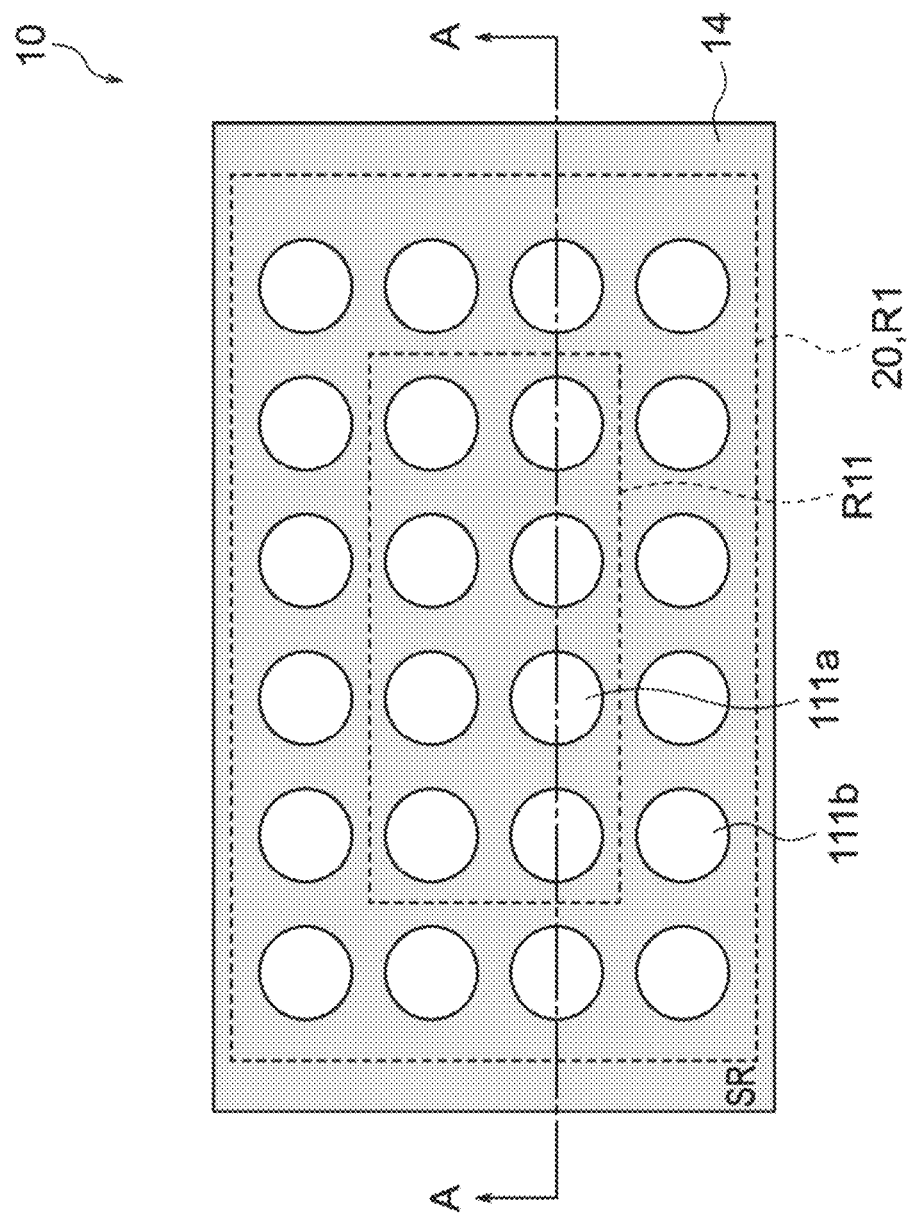
FIG. 3 is a plan view illustrating an example of the configuration of the semiconductor device according to the first embodiment.

FIG. 3 is a plan view illustrating an example of the configuration of the semiconductor device 1 according to the first embodiment. A line A-A of FIG. 3 illustrates a cross section corresponding to FIG. 2, which is a cross-sectional view. FIG. 3 is also a view of the wiring substrate 10 and the semiconductor chip 20 illustrated in FIG. 2 when viewed from above the paper surface. It is noted that FIG. 3 illustrates the surroundings of the semiconductor chip 20 in the wiring substrate 10. Further, the number and arrangement of the conductive connection portions 111a and 111b are not limited to the example illustrated in FIG. 3.

In FIG. 3, the region R12 illustrated in FIG. 2 is a region other than the region R11 of the chip region R1.

In the example illustrated in FIG. 3, the solder resist layer 14 (SR) is provided on the surface F1. The conductive connection portions 111a and 111b are partially exposed from the solder resist layer 14. The shapes of the conductive connection portions 111a and 111b illustrated in FIG. 3 are substantially circular, but are not limited thereto (refer to FIG. 4).

Next, the details of the conductive connection portions 111a and 111b and the columnar electrodes 16a and 16b will be described.

Figure 4:
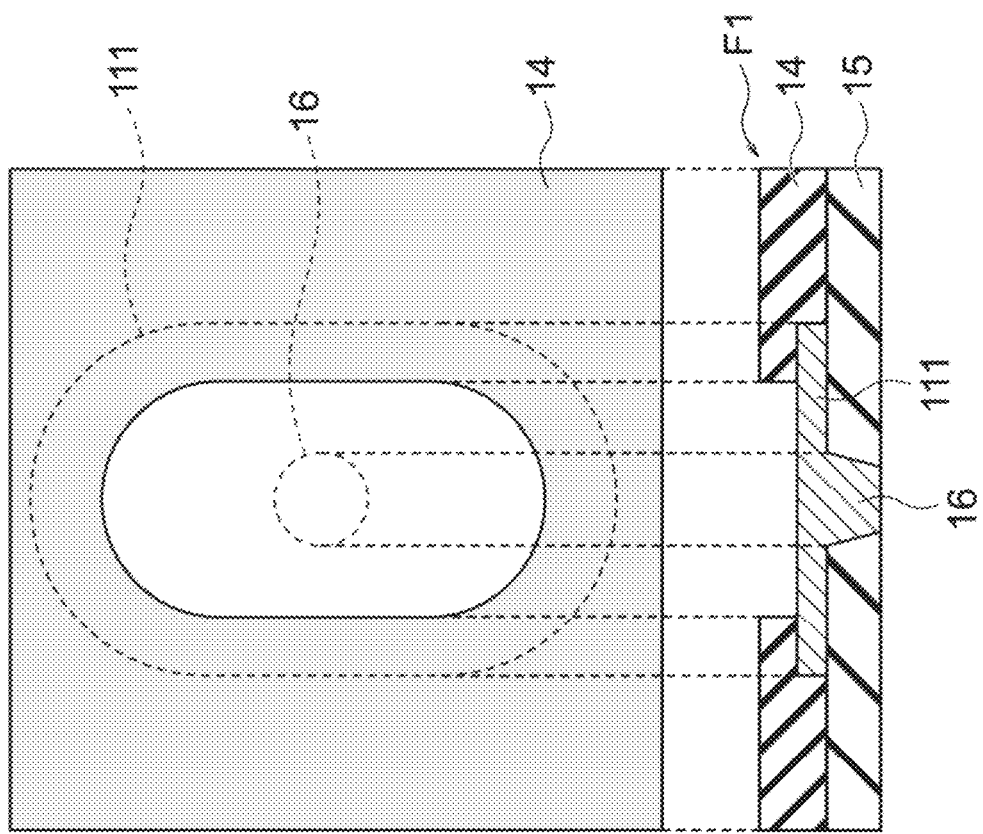
FIG. 4 is a view illustrating an example of a configuration of a conductive connection portion and a columnar electrode according to the first embodiment.

FIG. 4 is a view illustrating an example of a configuration of the conductive connection portion 111 and the columnar electrode 16 according to the first embodiment. FIG. 4 illustrates a plan view and a cross-sectional view of the conductive connection portion 111 and the columnar electrode 16.

The conductive connection portion 111 has, for example, a pad shape. A shape of the conductive connection portion 111 illustrated in the plan view of FIG. 4 is substantially elliptical, but may be rectangular, substantially circular, or the like. An upper surface of the conductive connection portion 111 is exposed from the solder resist layer 14.

As illustrated in the plan view of FIG. 4, the conductive connection portion 111 overlaps the columnar electrode 16 when viewed from the normal line direction of the surface F1. As illustrated in the cross-sectional view of FIG. 4, the columnar electrode 16 extends from the conductive connection portion 111 toward the surface F2. The conductive connection portion 111 and the columnar electrode 16 have, for example, a pad-on-via structure.

Figure 5:
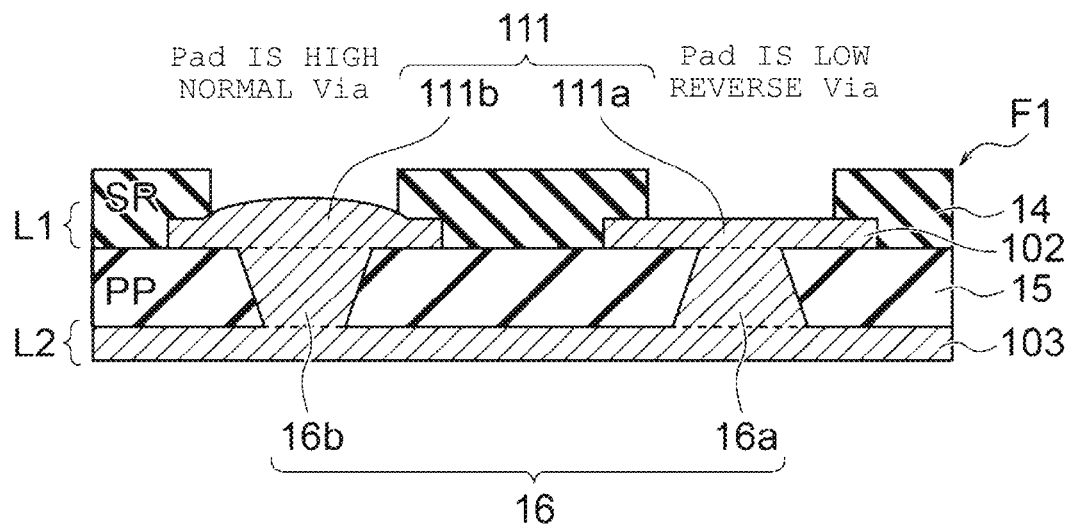
FIG. 5 is an enlarged cross-sectional view illustrating an example of the configuration of the columnar electrode and the conductive connection portion according to the first embodiment.

FIG. 5 is an enlarged cross-sectional view illustrating an example of a configuration of the columnar electrodes 16a and 16b and the conductive connection portions 111a and 111b according to the first embodiment.

The conductive connection portion 111b connected to the columnar electrode 16b, which is a normal via, is thicker than the conductive connection portion 111a connected to the columnar electrode 16a, which is a reverse via. In the example illustrated in FIG. 5, an upper surface of the conductive connection portion 111a located in the region R11 has a substantially flat shape. An upper surface of the conductive connection portion 111b located in the region R12 has a convex shape (convex portion). A pad height (thickness) of the conductive connection portion 111b is larger than a pad height of the conductive connection portion 111a due to the upward convex shape. The details of a difference between the conductive connection portion 111a and the conductive connection portion 111b will be described later with reference to FIGS. 7A to 7C.

Next, a method for manufacturing the semiconductor device 1 will be described.

FIGS. 6A to 6J are cross-sectional views illustrating an example of the method for manufacturing the semiconductor device 1 according to the first embodiment.

Figure 6A:
FIG. 6A is a cross-sectional view illustrating an example of a method for manufacturing the semiconductor device according to the first embodiment.

First, as illustrated in FIG. 6A, a dummy core 100 is prepared. The dummy core 100 has a supporting substrate 101 and the L1 wiring layer 102. The supporting substrate 101 is provided, for example, to improve a mechanical strength and facilitate conveyance of the wiring substrate 10. A temporary adhesive layer (not illustrated) is provided between the L1 wiring layer 102 and the supporting substrate 101.

Figure 6B:
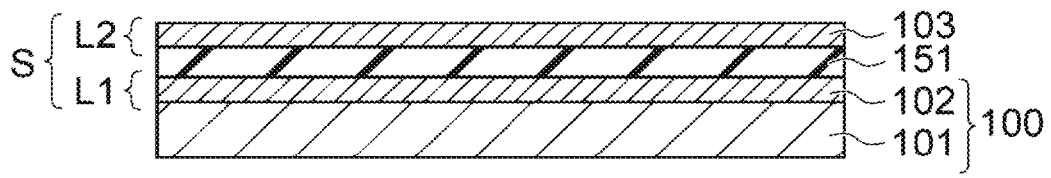
FIG. 6B is a cross-sectional view illustrating an example of the method for manufacturing the semiconductor device, following FIG. 6A.

Next, as illustrated in FIG. 6B, an insulating layer 151 and the L2 wiring layer 103 are formed on the dummy core 100. Accordingly, a stacked body S in which the insulating layer 151 (for example, a prepreg (PP)) is stacked to be interposed between the L1 wiring layer 102 and the L2 wiring layer 103 is formed. More specifically, the stacked body S is stacked on the supporting substrate 101 so that the L1 wiring layer 102 is in contact with the supporting substrate 101.

Figure 6C:
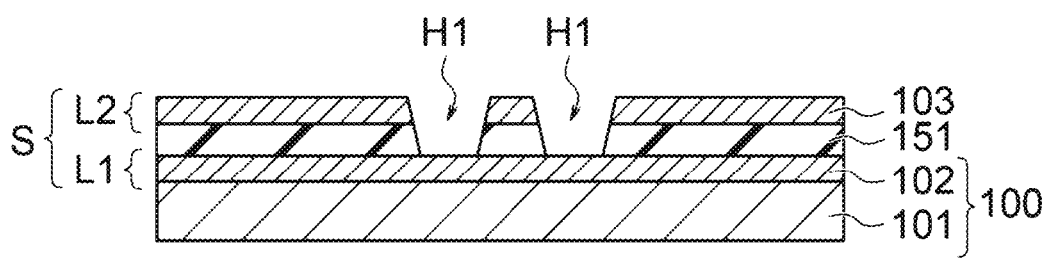
FIG. 6C is a cross-sectional view illustrating an example of the method for manufacturing the semiconductor device, following FIG. 6B.

Next, as illustrated in FIG. 6C, holes H1 are formed in a region R13 on the stacked body S. The region R13 corresponds to the region R11 illustrated in FIGS. 2 and 3. Each hole H1 penetrates the L2 wiring layer 103 and the insulating layer 151 from the L2 wiring layer 103 side to reach the L1 wiring layer 102.

The hole H1 is formed by, for example, a laser or the like. Accordingly, the hole H1 has a tapered shape of which width decreases from the L2 wiring layer 103 toward the L1 wiring layer 102.

Figure 6D:
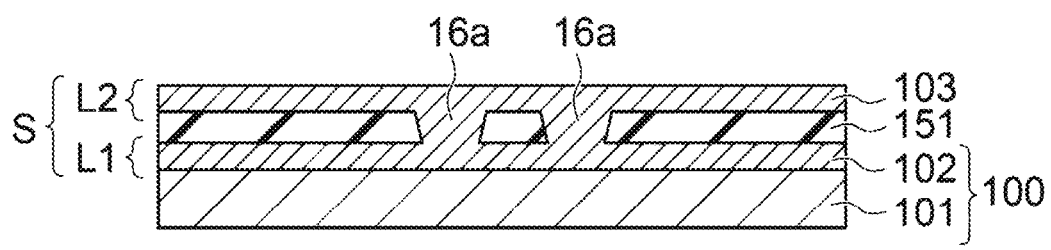
FIG. 6D is a cross-sectional view illustrating an example of the method for manufacturing the semiconductor device, following FIG. 6C.

Next, as illustrated in FIG. 6D, the columnar electrode 16a is formed in the hole H1. The columnar electrode 16a is formed by, for example, plating. The columnar electrode 16a has a tapered shape of which width decreases from the L2 wiring layer 103 toward the L1 wiring layer 102 according to a shape of the hole H1.

Figure 6E:
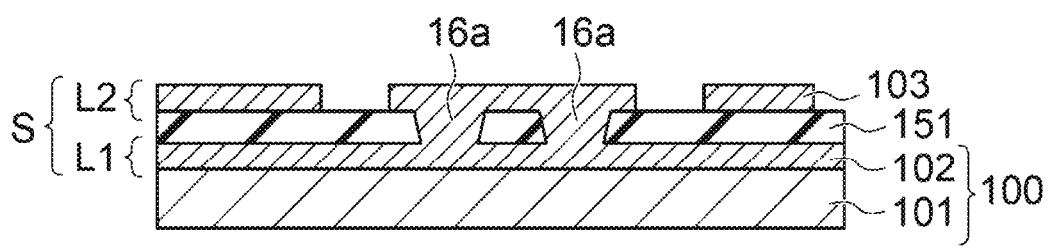
FIG. 6E is a cross-sectional view illustrating an example of the method for manufacturing the semiconductor device, following FIG. 6D.

Next, as illustrated in FIG. 6E, a circuit (wiring) is formed on the L2 wiring layer 103. The circuit is formed, for example, by etching using a mask.

Figure 6F:
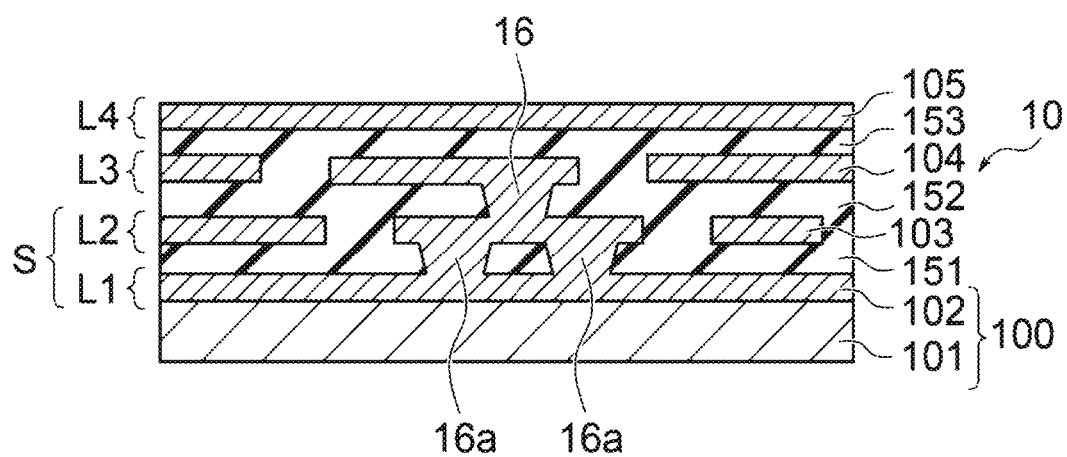
FIG. 6F is a cross-sectional view illustrating an example of the method for manufacturing the semiconductor device, following FIG. 6E.

Next, as illustrated in FIG. 6F, the L3 wiring layer 104, the L4 wiring layer 105, and insulating layers 152 and 153 are stacked. First, for example, the insulating layer 152 and the L3 wiring layer 104 are stacked on the L2 wiring layer 103. Next, a hole that penetrates the L3 wiring layer 104 and the insulating layer 152 to reach the L2 wiring layer 103 is formed. Next, the columnar electrode 16 is formed in the hole. Next, a circuit is formed on the L3 wiring layer 104. Next, the insulating layer 153 and the L4 wiring layer 105 are formed. In this manner, the wiring substrate 10 which is a four-layer substrate having four layers of the L1 wiring layer 102 to the L4 wiring layer 105 and three layers of the insulating layers 151 to 153 is formed.

The insulating layers 151 to 153 correspond to the insulating layer 15 illustrated in FIG. 2. The insulating layer 151 is located between the L1 wiring layer 102 and the L2 wiring layer 103. The insulating layer 152 is located between the L2 wiring layer 103 and the L3 wiring layer 104. The insulating layer 153 is located between the L3 wiring layer 104 and the L4 wiring layer 105.

In FIG. 6F, for example, the wiring substrate 10 illustrated in FIG. 6F may be formed by stacking a stacked body including the L3 wiring layer 104 on which a circuit is formed in advance on the L2 wiring layer 103.

Figure 6G:
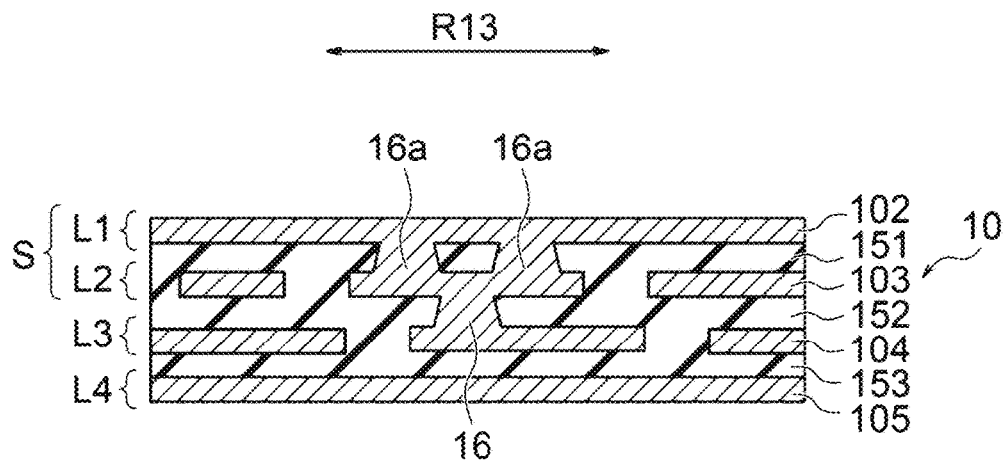
FIG. 6G is a cross-sectional view illustrating an example of the method for manufacturing the semiconductor device, following FIG. 6F.

Next, as illustrated in FIG. 6G, the supporting substrate 101 containing a temporary adhesive is peeled off from the L1 wiring layer 102. The wiring substrate 10 illustrated in FIG. 6G is upside down from the wiring substrate 10 illustrated in FIG. 6F. Therefore, an outermost wiring layer illustrated in FIG. 6G is the L1 wiring layer 102.

Figure 6H:
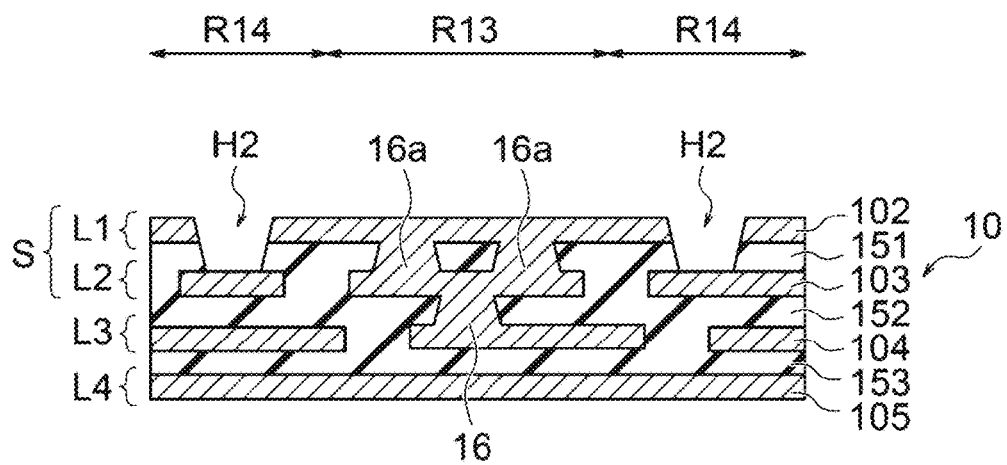
FIG. 6H is a cross-sectional view illustrating an example of the method for manufacturing the semiconductor device, following FIG. 6G.

Next, as illustrated in FIG. 6H, holes H2 are each formed in a region R14 on the stacked body S which is different from the region R13. The region R14 corresponds to the region R12 illustrated in FIG. 2. Each hole H2 penetrates L1 wiring layer 102 and the insulating layer 151 from the L1 wiring layer 102 side to reach the L2 wiring layer 103.

Similarly to the hole H1, the hole H2 is formed by, for example, a laser or the like. Accordingly, the hole H2 has a tapered shape of which width decreases from the L1 wiring layer 102 toward the L2 wiring layer 103.

Figure 6I:
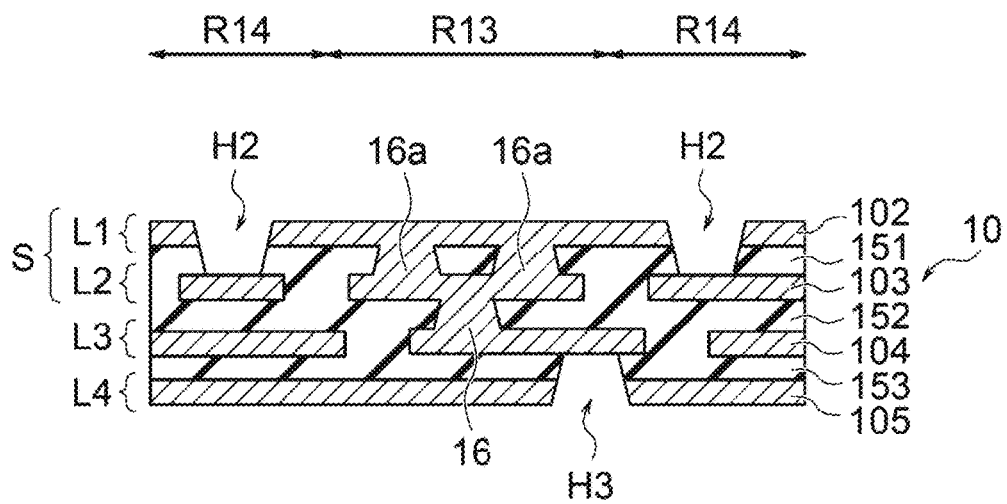
FIG. 6I is a cross-sectional view illustrating an example of the method for manufacturing the semiconductor device, following FIG. 6H.

Next, as illustrated in FIG. 6I, a hole H3 is formed. The hole H3 penetrates the L4 wiring layer 105 and the insulating layer 153 from the L4 wiring layer 105 side to reach the L3 wiring layer 104.

The hole H3 is formed by, for example, a laser or the like. Accordingly, the hole H3 has a tapered shape of which width decreases from the L4 wiring layer 105 toward the L3 wiring layer 104.

Figure 6J:
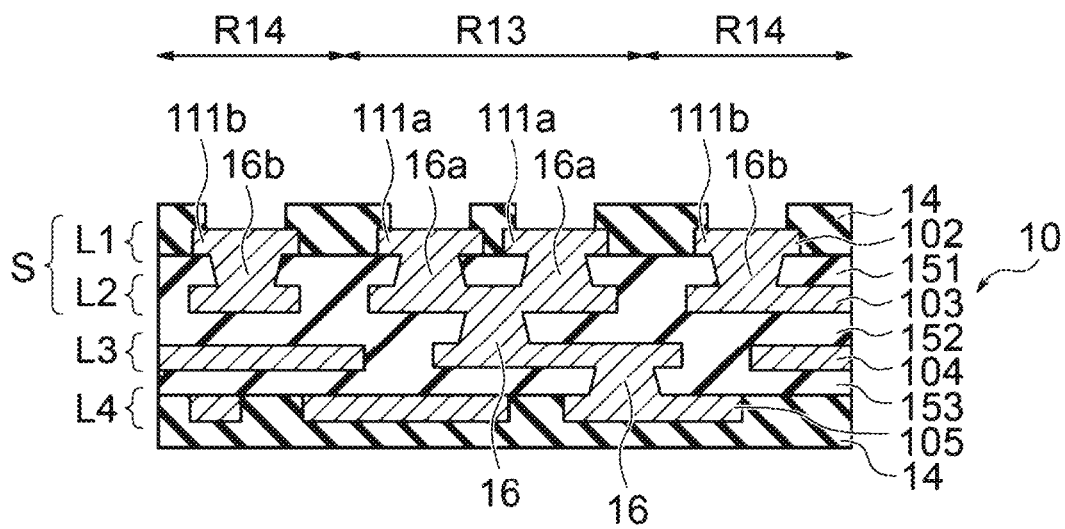
FIG. 6J is a cross-sectional view illustrating an example of the method for manufacturing the semiconductor device, following FIG. 6I.

Next, as illustrated in FIG. 6J, the columnar electrodes 16b and the columnar electrode 16 are formed in the holes H2 and the hole H3, respectively, and the conductive connection portions 111a connected to the columnar electrodes 16a and the conductive connection portions 111b connected to the columnar electrodes 16b are formed in the L1 wiring layer 102. In addition, a circuit is formed on the L1 wiring layer 102 by patterning to form the solder resist layer 14.

In a process of FIG. 6J, the columnar electrodes 16 and 16b are formed in parallel (simultaneously) by, for example, plating. The columnar electrode 16b has a tapered shape of which width decreases from the L1 wiring layer 102 toward the L2 wiring layer 103 according to a shape of the hole H2. The columnar electrode 16 has a tapered shape of which width decreases from the L4 wiring layer 105 toward the L3 wiring layer 104 according to a shape of the hole H3.

Herein, as illustrated in FIG. 6C, the hole H1 is formed from the L2 wiring layer 103 toward the L1 wiring layer 102. As illustrated in FIG. 6I, the hole H2 is formed from the L1 wiring layer 102 toward the L2 wiring layer 103. That is, the holes H1 and the holes H2 are formed from opposite directions and have tapered shapes in directions opposite to each other. Accordingly, the columnar electrode 16a and the columnar electrode 16b have tapered shapes in directions opposite to each other. The directions of the taper shapes of the columnar electrodes 16 not connected to the conductive connection portions 111a and 111b, that is, the columnar electrodes 16 provided on the insulating layers 152 and 153 may be any direction.

Next, the semiconductor chip 20 is provided on the wiring substrate 10 having the stacked body S so as to be electrically connected to the conductive connection portion 111a and the conductive connection portion 111b. After that, for example, the resin layer 80 is formed, the semiconductor chips 30 to 33 and the like are provided, and the bonding wire 90 and the sealing resin 91 are formed, so that the semiconductor device 1 illustrated in FIG. 1 is completed.

Next, a difference in a pad height and an upper surface shape between the conductive connection portion 111a and the conductive connection portion 111b will be described.

Figure 7A:
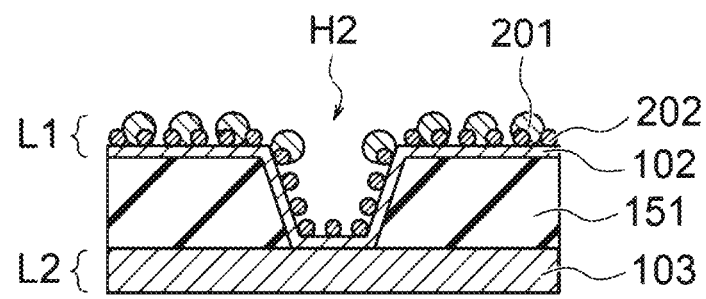
FIG. 7A is a cross-sectional view illustrating an example of plating growth of the columnar electrode according to the first embodiment.
Figure 7B:
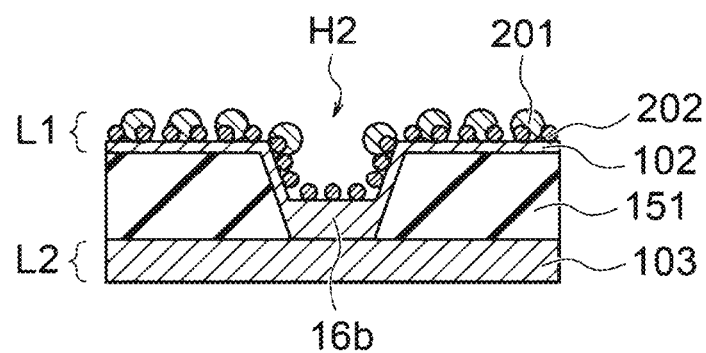
FIG. 7B is a cross-sectional view illustrating an example of plating growth of the columnar electrode, following FIG. 7A.
Figure 7C:
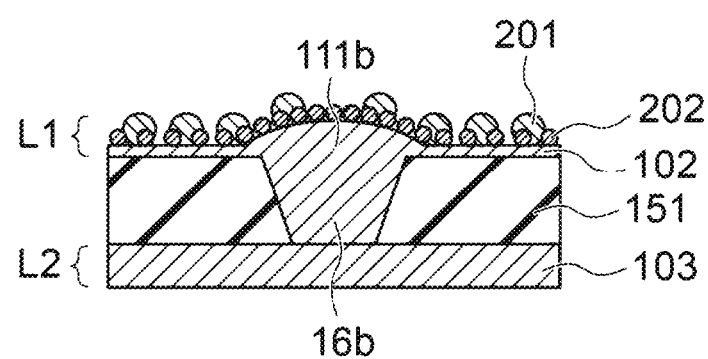
FIG. 7C is a cross-sectional view illustrating an example of plating growth of the columnar electrode, following FIG. 7B.

FIGS. 7A to 7C are cross-sectional views illustrating an example of plating growth of the columnar electrode 16b according to the first embodiment. FIGS. 7A to 7C illustrate, for example, the plating growth of the columnar electrode 16b in FIG. 6J. As illustrated in FIG. 6J, the columnar electrode 16b grows from the L2 wiring layer 103 toward the L1 wiring layer 102 in the hole H2.

A plating solution contains, for example, an inhibitor 201 and an accelerator 202. The inhibitor 201 prevents the plating growth. The accelerator 202 accelerates the plating growth. The inhibitor 201 and the accelerator 202 are adsorbed on the wiring substrate 10 immersed in the plating solution. The inhibitor 201 is easily adsorbed on a surface layer. The accelerator 202 is adsorbed substantially uniformly over all.

As illustrated in FIG. 7A, the inhibitor 201 is easily adsorbed on a surface layer of the insulating layer 151 or a seed layer, but is not easily adsorbed in the hole H2. Meanwhile, the accelerator 202 is also uniformly adsorbed on an inclined surface of the hole H2. Therefore, a density of the accelerator 202 in the hole H2 is higher than a density of the accelerator on a surface layer of the L1 wiring layer 102.

As illustrated in FIG. 7B, the plating growth is preferentially performed in the hole H2 as compared with the L1 wiring layer 102. This is because the plating growth in the hole H2 is faster than the plating growth on the surface layer of the L1 wiring layer 102 due to the above positional relationship between the inhibitor 201 and the accelerator 202. Further, as the plating growth progresses, a position of a bottom of the hole H2 becomes higher, and the density of the accelerator 202 at the bottom of the hole H2 becomes higher. Accordingly, the plating growth in the hole H2 becomes even faster.

As the plating growth furthermore progresses, as illustrated in FIG. 7C, the columnar electrode 16 in the hole H2 grows beyond a height of the L1 wiring layer 102. Accordingly, as described with reference to FIG. 5, the upper surface of the conductive connection portion 111b has a convex shape.

A direction of the plating growth of the columnar electrode 16a is opposite to a direction of the plating growth of the columnar electrode 16b. That is, as illustrated in FIG. 6D, the columnar electrode 16a is formed by performing the plating growth from the L1 wiring layer 102 toward the L2 wiring layer 103. Therefore, the upper surface of the conductive connection portion 111a illustrated in FIG. 5 is not convex but substantially flat.

As described above, according to the first embodiment, the columnar electrode 16a located in the region R11 has a tapered shape in a direction opposite to that of the columnar electrode 16b located in the region R12 when viewed from the normal line direction of the surface F1. That is, the hole H1 in which the columnar electrode 16a is buried and the hole H2 in which the columnar electrode 16b is buried are formed from different directions. Therefore, the shape of the upper surface differs between the conductive connection portion 111a and the conductive connection portion 111b. That is, a thickness of the conductive connection portion 111 changes according to a position of the wiring substrate 10. As a result, even when the semiconductor chip 20 is warped, the semiconductor chip 20 can be more appropriately connected to the wiring substrate 10.

It is noted that the number of wiring layers 11 of the wiring substrate 10 is not limited to four, and may be two or more. That is, the wiring substrate 10 includes at least two layers of the L1 wiring layer 102 and the L2 wiring layer 103. The columnar electrodes 16a and 16b of which taper shapes are opposite to each other may be provided on the same insulating layer 151.

Further, the thicknesses of the conductive connection portions 111a and 111b may be a height of the upper surface.

Further, the columnar electrodes 16a may not be formed in a process illustrated in FIG. 6D, and the columnar electrodes 16, 16a, and 16b may be formed in parallel in the process illustrated in FIG. 6J.

Next, as Comparative Example 1, a case where the taper directions of the columnar electrodes 16 are all the same will be described.

FIG. 8 is a cross-sectional view illustrating an example of a configuration of a semiconductor chip 20 and surroundings thereof according to Comparative Example 1. It is noted that FIG. 8 illustrates a cross-sectional view at the timing of connection of the semiconductor chip 20 to the wiring substrate 10.

The columnar electrode 16 connected to the conductive connection portion 111 is, for example, a normal via. In this case, the heights of the upper surfaces of all the conductive connection portions 111 are substantially the same. Therefore, due to the warpage of the semiconductor chip 20, it may be difficult to connect the semiconductor chip 20 to the wiring substrate 10.

Meanwhile, in the first embodiment, the columnar electrodes 16a and 16b having different tapered shapes are mixed, and thus, the thicknesses of the conductive connection portions 111a and 111b are different. Accordingly, the semiconductor chip 20 can be more appropriately connected to the wiring substrate 10.

Further, as Comparative Example 2, a case where a plurality of pad structures of the conductive connection portion 111 are mixed will be described.

As a pad structure other than the pad-on-via structure, the conductive connection portion 111 may be located at a position away from the columnar electrode 16 in a plan view by, for example, wiring lead-out in the L1 wiring layer 102. Further, the conductive connection portion 111 may be exposed from, for example, the solder resist layer 14 and have a wiring shape.

When the plurality of the pad structures of the conductive connection portion 111 are mixed, there may occur variations in the pad height of the conductive connection portion 111 according to a position on the surface F1. When the conductive connection portion 111 in the region R12, which is the chip outer peripheral region, has a pad structure having a low pad height, due to the warpage of the semiconductor chip 20, the connectivity may be easily reduced.

Meanwhile, in the first embodiment, all the conductive connection portions 111a and 111b have the same pad-on-via structure. Accordingly, variations in the thickness of the conductive connection portions 111a and 111b can be reduced, and for example, a connection margin for the warpage of the semiconductor chip 20 can be improved. As a result, the connectivity between the semiconductor chip 20 and the wiring substrate 10 can be improved.

Second Embodiment

Figure 9:
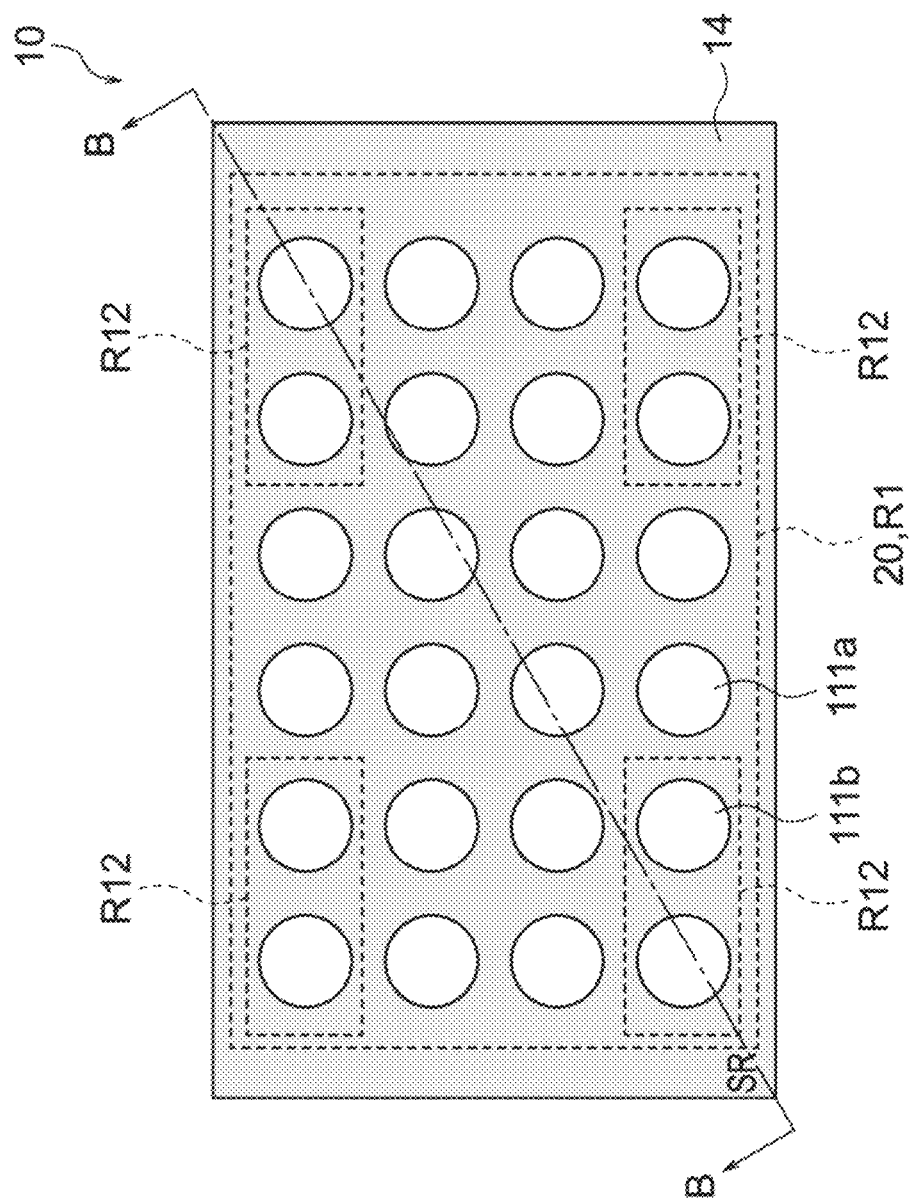
FIG. 9 is a plan view illustrating an example of a configuration of a semiconductor device according to a second embodiment.

FIG. 9 is a plan view illustrating an example of a configuration of a semiconductor device 1 according to a second embodiment. In the second embodiment, the positions of the region R11 and the region R12 are different from those in the first embodiment. A line B-B of FIG. 9 illustrates a cross section corresponding to FIG. 2, which is a cross-sectional view.

The region R12 is, for example, a chip corner region. The chip corner region corresponds to a region including four corners of the semiconductor chip 20. The region R11 is a region other than the chip corner region of the chip region R1.

On a diagonal line of the semiconductor chip 20 illustrated in FIG. 9, an influence of the warpage of the semiconductor chip 20 is likely to greatly occur. Therefore, the region R12 in which the relatively thick conductive connection portion 111b is located may be a chip corner region where the connectivity is likely to deteriorate.

As in the second embodiment, the positions of the region R11 and the region R12 may be changed.

The semiconductor device 1 according to the second embodiment can obtain the same effects as those of the first embodiment.

Third Embodiment

Figure 10:
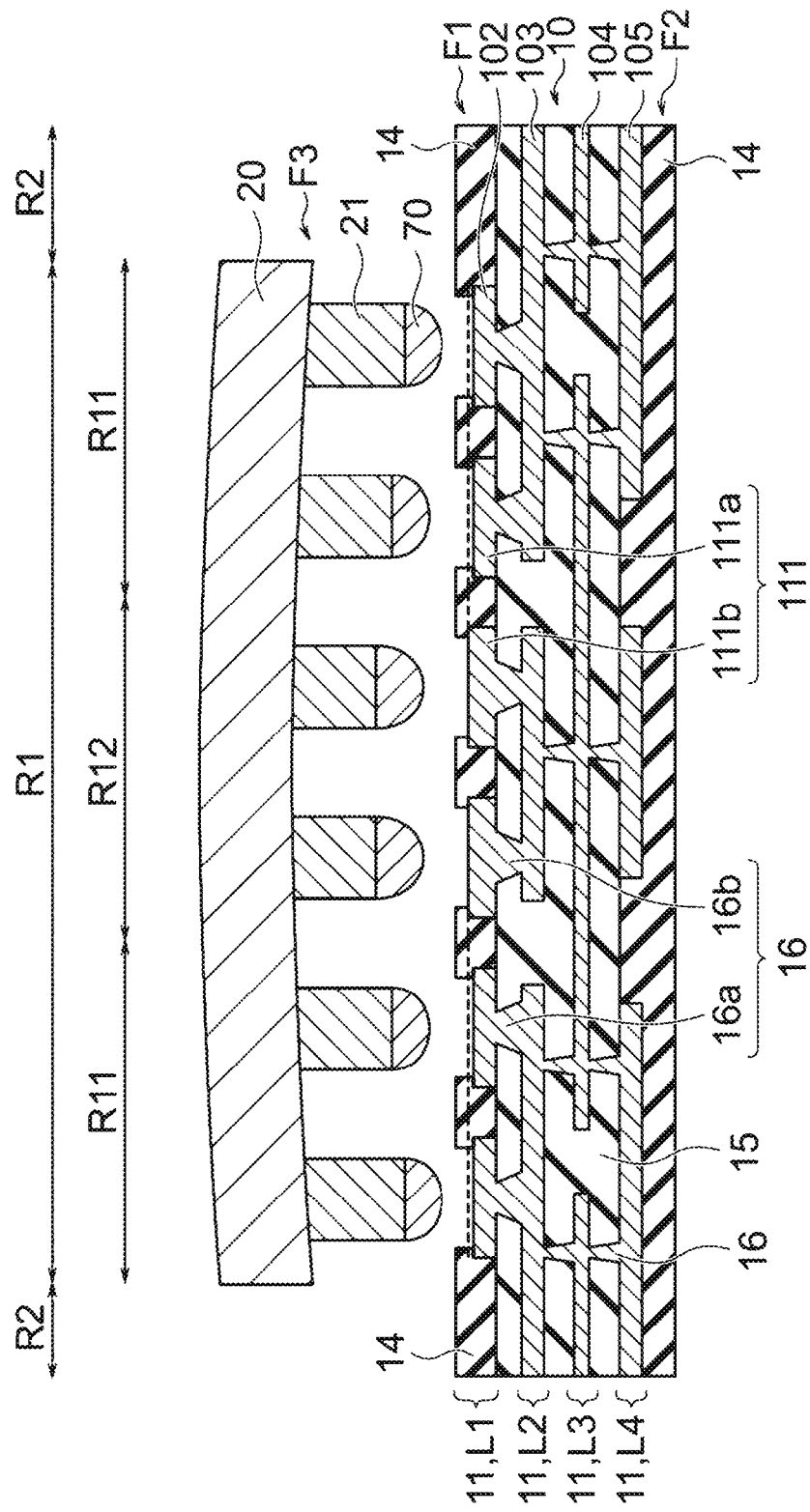
FIG. 10 is a cross-sectional view illustrating an example of a configuration of a semiconductor chip and surroundings thereof according to a third embodiment.
Figure 11:
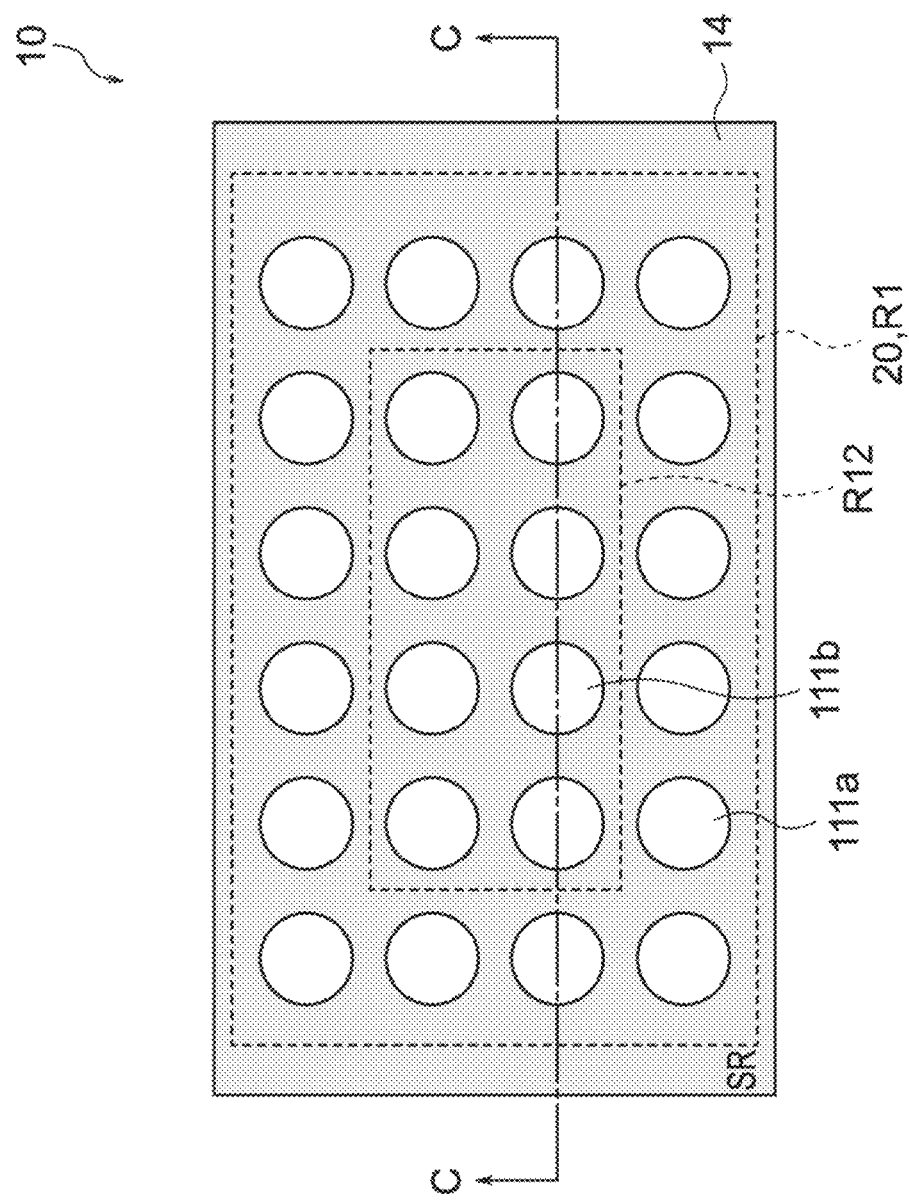
FIG. 11 is a plan view illustrating an example of a configuration of a semiconductor device according to the third embodiment.

FIG. 10 is a cross-sectional view illustrating an example of a configuration of a semiconductor chip 20 and surroundings thereof according to a third embodiment. FIG. 11 is a plan view illustrating an example of a configuration of a semiconductor device 1 according to the third embodiment. The third embodiment is different from the first embodiment in that the position of the region R11 and the position of the region R12 are reversed. A line C-C of FIG. 11 illustrates a cross section corresponding to FIG. 10, which is a cross-sectional view.

In the examples illustrated in FIGS. 10 and 11, the region R12 is, for example, a chip center region. The region R11 is, for example, a chip outer peripheral region. Therefore, the conductive connection portion 111b located in the region R12 which is the chip center region is thicker than the conductive connection portion 111a located in the region R11 which is the chip outer peripheral region. Accordingly, for example, when the semiconductor chip 20 is warped to be convex upward at the timing of connection of the semiconductor chip 20 to the wiring substrate 10, the semiconductor chip 20 can be more appropriately connected to the wiring substrate 10.

As in the third embodiment, the position of the region R11 and the position of the region R12 may be reversed.

The semiconductor device 1 according to the third embodiment can obtain the same effects as those of the first embodiment.

Fourth Embodiment

Figure 12:
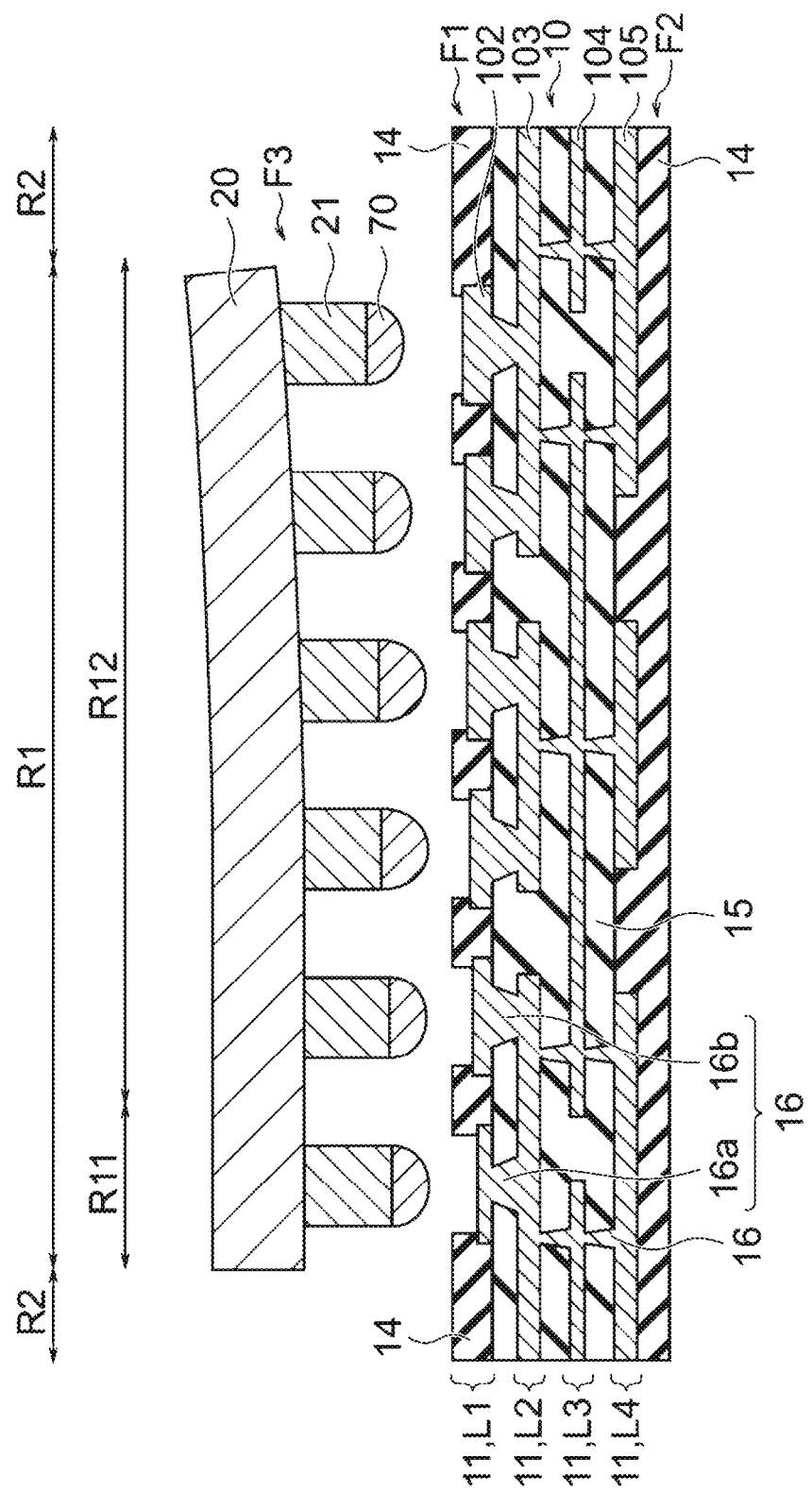
FIG. 12 is a cross-sectional view illustrating an example of a configuration of a semiconductor chip and surroundings thereof according to a fourth embodiment.
Figure 13:
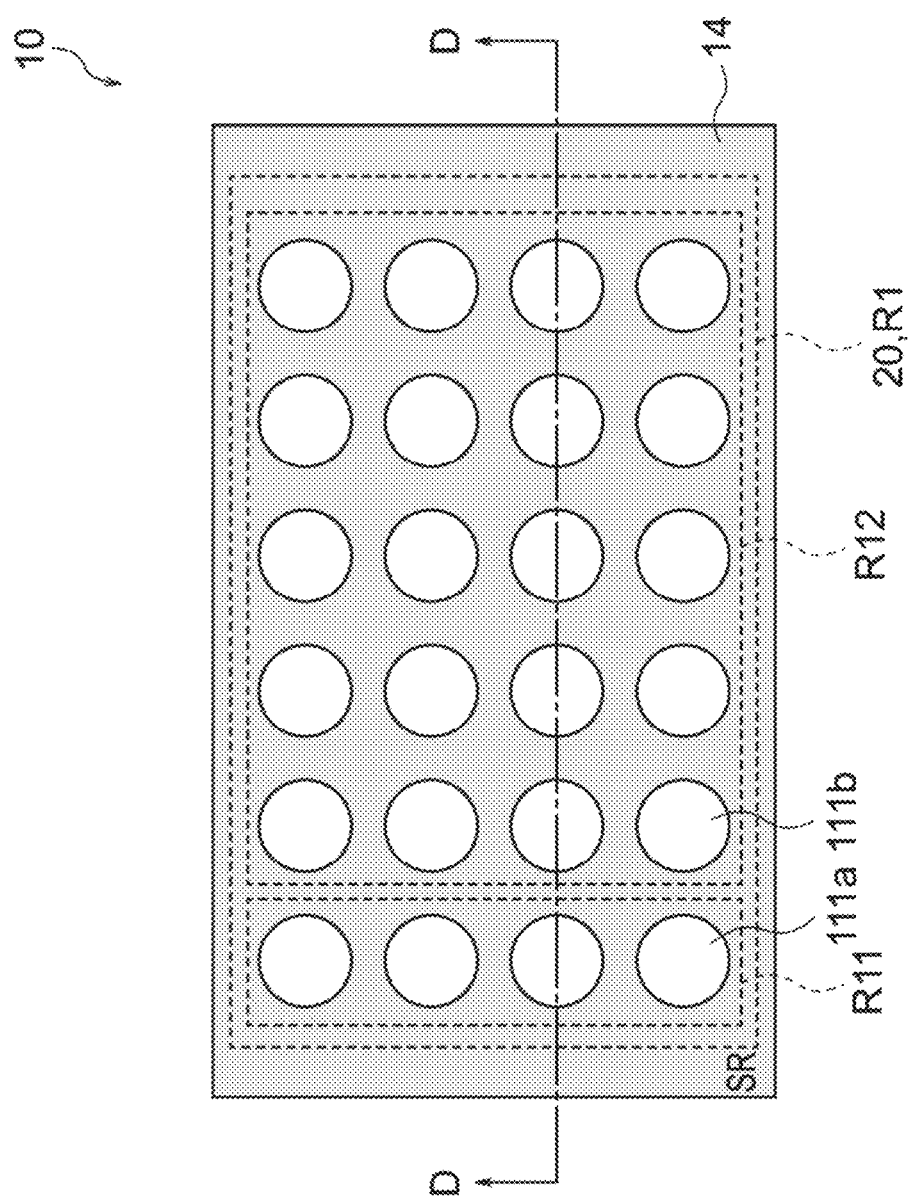
FIG. 13 is a plan view illustrating an example of a configuration of a semiconductor device according to the fourth embodiment.

FIG. 12 is a cross-sectional view illustrating an example of a configuration of a semiconductor chip 20 and surroundings thereof according to a fourth embodiment. FIG. 13 is a plan view illustrating an example of a configuration of a semiconductor device 1 according to the fourth embodiment. The fourth embodiment is different from the first embodiment in that the thickness of the conductive connection portion 111 is controlled by a width of the columnar electrode 16. A line D-D of FIG. 13 illustrates a cross section corresponding to FIG. 12, which is a cross-sectional view.

The regions R11 and R12 are located side by side in a direction parallel to the surface F1. In the example illustrated in FIG. 13, the region R11 is located on a left side of the chip region R1. The region R12 is located on a right side of the chip region R1. Accordingly, the thicknesses of the conductive connection portions 111a and 111b change in a horizontal direction of the paper surface of FIG. 3.

As illustrated in FIG. 12, in the region R12, a width of the columnar electrode 16b, which is a normal via, and the thickness of the conductive connection portion 111b are not uniform. As a distance from the region R11 increases, the width of the columnar electrode 16b gradually (stepwisely) increases. As the distance from the region R11 increases, the thickness of the conductive connection portion 111b gradually increases.

Figure 14:
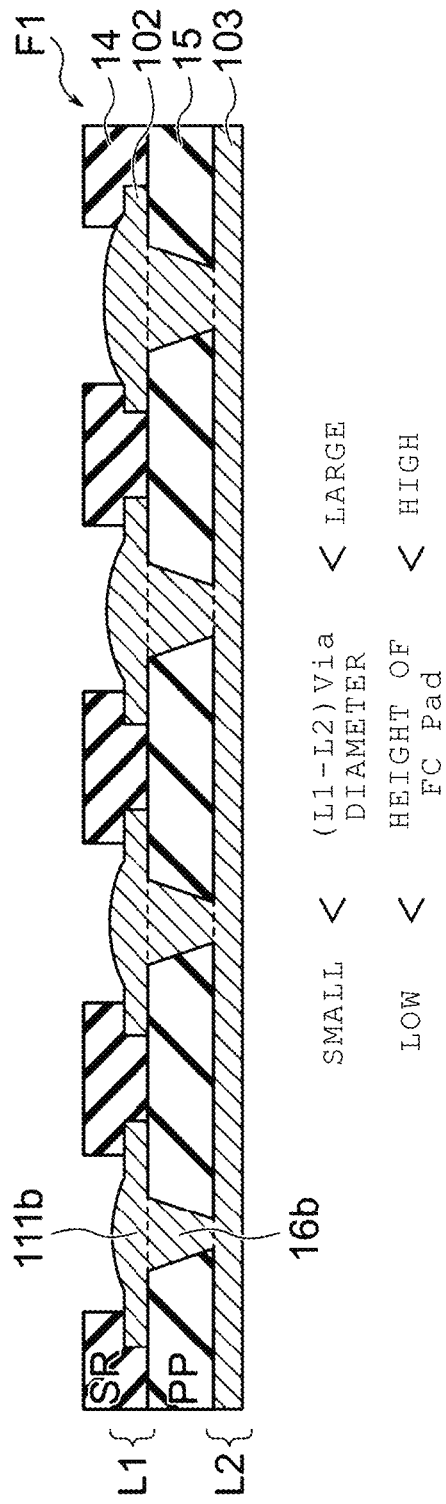
FIG. 14 is a view illustrating a relationship between a width of a columnar electrode and a thickness of a conductive connection portion.

FIG. 14 is a view illustrating a relationship between the width of the columnar electrode 16b and the thickness of the conductive connection portion 111b.

As illustrated in FIG. 14, as the width (via diameter) of the columnar electrode 16b becomes larger, the conductive connection portion 111b becomes thicker. On the other hand, as the width of the columnar electrode 16b becomes smaller, the conductive connection portion 111b becomes thinner. This is because, as the width of the columnar electrode 16b becomes larger, the density of the accelerator 202 at the bottom of the hole H2 illustrated in FIG. 7B becomes higher. Therefore, a rate of the plating growth can be changed by changing a width of the hole H2. As a result, in the columnar electrode 16b which is a normal via, a thickness of a convex portion of the conductive connection portion 111b, that is, the thickness of the conductive connection portion 111b can be controlled. Therefore, the thicknesses of the conductive connection portions 111a and 111b can be adjusted according to the warpage of the semiconductor chip 20. Accordingly, the semiconductor chip 20 can be furthermore easily connected to the wiring substrate 10.

That is, the conductive connection portion 111b has a thickness corresponding to the width of the columnar electrode 16b having a tapered shape of which width decreases from the surface F1 toward the surface F2. More specifically, as the width of the columnar electrode 16b having a tapered shape of which width decreases from the surface F1 toward the surface F2 increases, the conductive connection portion 111b becomes thicker.

In addition, as illustrated in FIG. 12, the thicknesses of the conductive connection portions 111a and 111b gradually change from the region R11 to the region R12. That is, the thicknesses of the conductive connection portions 111a and 111b gradually change at a boundary between the region R11 and the region R12, without extremely changing.

As in the fourth embodiment, the thickness of the conductive connection portion 111 may be controlled by the width of the columnar electrode 16.

The semiconductor device 1 according to the fourth embodiment can obtain the same effects as those of the first embodiment. Further, for example, in the first embodiment, the thicknesses of the conductive connection portions 111a and 111b may gradually change from a chip center portion to a chip outer peripheral end portion. More specifically, the conductive connection portion 111b illustrated in FIG. 2 may become gradually thicker from the chip center portion to the chip outer peripheral end portion. In this case, the width of the columnar electrode 16b gradually increases from the chip center portion to the chip outer peripheral end portion.

Fifth Embodiment

FIG. 15 is a cross-sectional view illustrating an example of a configuration of a semiconductor chip 20 and surroundings thereof according to a fifth embodiment. The fifth embodiment is different from the first embodiment in that the tapered shapes of the columnar electrode 16a and the columnar electrode 16b are reversed.

In the example illustrated in FIG. 15, the columnar electrode 16a located in the region R11 has a tapered shape of which width decreases from the surface F1 toward the surface F2. The columnar electrode 16a is a normal via.

In the example illustrated in FIG. 15, the columnar electrode 16b located in the region R12 has a tapered shape of which width increases from the surface F1 toward the surface F2. The columnar electrode 16b is a reverse via.

Further, in the fifth embodiment, the upper surface of the conductive connection portion 111a located in the region R11 illustrated in FIG. 15 has a substantially flat shape. The upper surface of the conductive connection portion 111b located in the region R12 has a convex shape.

Similarly to the first embodiment, the conductive connection portion 111b located in the region R12 is thicker than the conductive connection portion 111a located in the region R11. Therefore, in the example illustrated in FIG. 15, the conductive connection portion 111b connected to the columnar electrode 16b, which is a reverse via, is thicker than the conductive connection portion 111a connected to the columnar electrode 16a, which is a normal via. As described above, in the fifth embodiment, a relationship between the tapered shapes of the columnar electrodes 16a and 16b and the thicknesses of the conductive connection portions 111a and 111b is reversed as compared with the first embodiment.

In some cases, a tendency of the thicknesses of the conductive connection portions 111a and 111b may change according to a composition of the plating, the plating solution used for forming the columnar electrodes 16a and 16b, or the like. For example, if a ratio or a component of the inhibitor 201 and the accelerator 202 changes, there is a possibility that the columnar electrode 16b, which is a reverse via, may grow faster than the columnar electrode 16a, which is a normal via, even under the same plating conditions. It is noted that the columnar electrode 16a and the columnar electrode 16b may be formed at the same time. Alternatively, one of the columnar electrodes 16a and 16b may be formed first corresponding to FIGS. 6C and 6D, and the other of the columnar electrodes 16a and 16b may formed to correspond to FIGS. 6H to 6J. When one of the columnar electrodes 16a and 16b is formed first, the plating conditions such as the plating solution to be used may be different for each thereof.

As in the fifth embodiment, the tapered shapes of the columnar electrode 16a and the columnar electrode 16b may be reversed.

The semiconductor device 1 according to the fifth embodiment can obtain the same effects as those of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a substrate having a first surface, a second surface opposite to the first surface, a plurality of conductive connections provided on the first surface, and a plurality of columnar electrodes each extending from a corresponding one of the plurality of conductive connections toward the second surface, each of the plurality of columnar electrodes having a tapered shape; and
a semiconductor chip having a third surface facing the first surface and a plurality of connection bumps provided on the third surface, each of the plurality of connection bumps electrically connected to a corresponding one of the plurality of conductive connections, wherein
a first one of the columnar electrodes, located in a first region of a chip region, has a first tapered shape, and a second one of the columnar electrodes, located in a second region of the chip region, has a second tapered shape different from the first tapered shape.

2. The semiconductor device according to claim 1, wherein
an upper surface of each of the conductive connections located in the first region has a flat shape, and
an upper surface of each of the conductive connections located in the second region has a convex shape.

3. The semiconductor device according to claim 1, wherein a second one of the conductive connections located in the second region has a thickness different from a thickness of a first one of the conductive connections located in the first region.

4. The semiconductor device according to claim 3, wherein the second conductive connection is thicker than the first conductive connection.

5. The semiconductor device according to claim 1, wherein a thickness of one of the conductive connections gradually changes from the first region to the second region.

6. The semiconductor device according to claim 1, wherein at least one of the conductive connections has a thickness corresponding to a width of the first or second columnar electrode that has a width decreasing from the first surface toward the second surface.

7. The semiconductor device according to claim 1, wherein
the first columnar electrode has a width increasing from the first surface toward the second surface, and
the second columnar electrode has a width decreasing from the first surface toward the second surface.

8. The semiconductor device according to claim 1, wherein
the first columnar electrode has a width decreasing from the first surface toward the second surface, and
the second columnar electrode has a width increasing from the first surface toward the second surface.

9. The semiconductor device according to claim 1, wherein
the first region is a chip center region, and
the second region is a chip outer peripheral region.

10. The semiconductor device according to claim 1, wherein
the second region is a chip corner region, and
the first region is a region other than the chip corner region of the chip region.

11. The semiconductor device according to claim 1, wherein
the first region is a chip outer peripheral region, and
the second region is a chip center region.

12. The semiconductor device according to claim 1, wherein the first region and the second region are located side by side.

13. A substrate comprising:
a first surface;
a second surface opposite to the first surface;
a plurality of conductive connections provided on the first surface; and
a plurality of columnar electrodes each extending from a corresponding one of the plurality of conductive connection portions toward the second surface and having a tapered shape, wherein
a first one of the columnar electrodes located in a first region of a chip region has a first tapered shape, and a second one of the columnar electrodes located in a second region of the chip region has a second tapered shape different from the first tapered shape.

14. A method for manufacturing a semiconductor device, comprising:
forming, in a first region of a stacked body that includes a first wiring layer, an insulating layer, and a second wiring layer, a first hole penetrating at least the insulating layer to extend from the second wiring layer to the first wiring layer;
forming, in a second region of the stacked body, a second hole penetrating at least the insulating layer to extend from the second wiring layer to the first wiring layer;
wherein the first region is different from the second region;
forming the first hole with a first tapered shape that has a width decreasing from the second wiring layer toward the first wiring layer, and
forming the second hole with a second tapered shape that has a width decreasing from the first wiring layer toward the second wiring layer.

15. The method according to claim 14, wherein
the first region is a chip center region, and
the second region is a chip outer peripheral region.

16. The method according to claim 14, wherein
the second region is a chip corner region, and
the first region is a region other than the chip corner region of the chip region.

17. The method according to claim 14, wherein
the first region is a chip outer peripheral region, and
the second region is a chip center region.

* * * * *